March 14, 1961 H. M. STRAUBE 2,975,301

UNIDIRECTIONAL SIGNAL TRANSLATING DEVICE

Filed Oct. 28, 1957

INVENTOR
H. M. STRAUBE
BY
H. O. Wright
ATTORNEY

United States Patent Office 2,975,301
Patented Mar. 14, 1961

2,975,301

UNIDIRECTIONAL SIGNAL TRANSLATING DEVICE

Harold M. Straube, Mendham, N.J., assignor to Bell Telephone Laboratories, Incorporated, New York, N.Y., a corporation of New York Filed Oct. 28, 1957, Ser. No. 692,707

8 Claims. (Cl. 307—88.5)

This invention relates to improved rectifying circuits. More particularly, it relates to rectifying circuits employing a plurality of semiconductive elements.

In the circuits of the invention, substantially improved signal sensitivity and forward-to-reverse current characteristics are achieved by arrangements which employ the emitter-to-base junction of a first transistor as a first rectifier and amplify the signal from the collector circuit of this first transistor to actuate a second rectifying circuit connected electrically in shunt with the first rectifier to strongly enhance its signal sensitivity to signals of the chosen polarity. By adroitly proportioned and positioned biasing means, the shunting circuit is rendered positively nonconducting to signals of the reverse polarity without sensibly detracting from its effectiveness in aiding the forward conduction characteristics of the overall rectifying circuit.

Accordingly, a principal object of the invention is to increase the signal sensitivity of rectifying circuits.

A further object is to improve the forward-to-reverse characteristics of rectifying circuits.

Other objects and advantages will become apparent from the following detailed description of illustrative circuits and from the appended claims.

Figure 1:
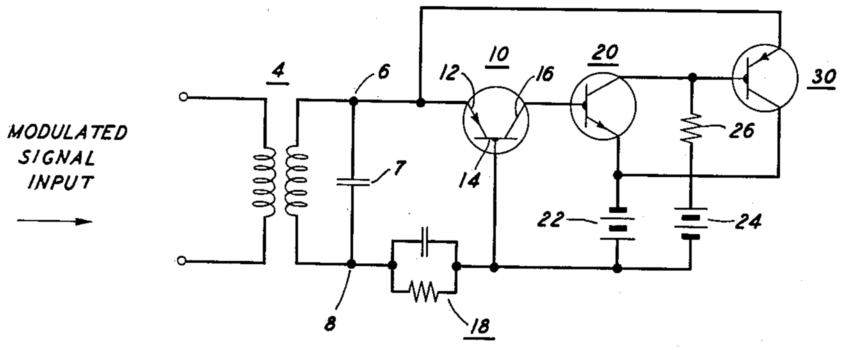
Figure 2:
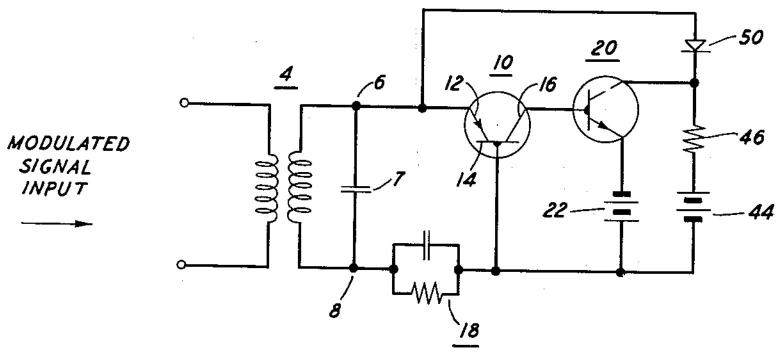

In the accompanying drawings:

Fig. 1 is an electrical schematic diagram of a rectifying circuit of the invention; and Fig. 2 is an electrical schematic diagram of a second somewhat simpler rectifying circuit of the invention.

Referring more particularly to the drawings, Fig. 1 shows a rectifier in accordance with the invention connected in circuit for rectification of a signal which may, for example, be a modulated radio frequency signal.

Such a modulated signal, as indicated in the drawing, is applied from a source not shown, through a tuned coupling stage 4 to a pair of input terminals 6 and 8. The coupling stage 4 may, for example, comprise a well known radio intermediate frequency transformer provided with a tuning capacitor 7 as shown. The input terminals 6 and 8 are connected in circuit with a transistor 10 having an emitter electrode 12, a base electrode 14, and a collector electrode 16. This transistor may, for example, be a three electrode junction transistor such as that described in W. A. Shockley Patent Number 2,569,347, granted September 25, 1951.

The emitter electrode 12 and the base electrode 14 of the transistor 10 are respectively connected to the input terminals 6 and 8, as shown. Thus the junction barrier existing between the emitter and base electrodes, in accordance with the Shockley teachings, presents an impedance of substantially two different magnitudes to signals applied to the input terminals, in dependence primarily upon the direction or polarity of those signals. The base electrode 14 is connected to the input terminal 8 through a resistor-capacitor network 18 having a time constant chosen, in accordance with the well known theory, for detecting the modulation frequency component of the input signal and for passing the high frequency portion of that same signal.

An amplifying transistor 20, provided with biasing potential sources 22 and 24, here two batteries, and a load resistor 26, is connected in well known common emitter configuration as shown for amplifying signals derived at the collector electrode 16 of the transistor 10. This amplifying transistor 20 is of a conductivity type opposite to that of the transistor 10; in this illustrative embodiment the transistor 20 is of p conductivity type and the transistor 10, as shown, is of n conductivity type.

A third transistor 30, of a conductivity type like to that of the first transistor 10, is connected in a common collector configuration to be controlled by signals derived at the collector electrode of the amplifying transistor 20 and appearing across the load resistor 26. Thus, the conduction path between the emitter and collector electrode of the transistor 30, is connected, through the biasing battery 22, in parallel with the rectifying path between the emitter and base electrodes of the transistor 10.

Operationally this circuit of Fig. 1 functions as described below. An input signal of an appropriate frequency applied to the coupling stage 4 faces a very small impedance between the emitter electrode 12 and the base electrode 14 at an instant when that signal is of a polarity such that the input terminal 6 is positive with respect to the input terminal 8. The current thus flowing acorss the transistor junction separating these two electrodes, as is well known in the art, is amplified at the collector electrode 16. This amplified current flows to the base electrode of the transistor 20 in a direction to increase the current flow in the principal conduction path of that transistor, namely from emitter electrode to collector electrode. This increased current flow, passing through the load resistor 26, drives the potential of the base electrode of the transistor 30 in a direction to inhibit and overcome the Off biasing potential of the source 24. Hence an extremely low impedance exists in the principal conduction path of this latter transistor 30. Indeed, currents flowing in this principal conduction path from the emitter to the collector electrodes of transistor 30 are amplified, in accordance with the well known transistor theory.

As shown, the emitter electrode of transistor 30 is directly connected to the input terminal 6 and to the emitter electrode 12 of the transistor 10. Thus, a forward going signal current applied to the emitter and base electrode of the transistor 10 encounters the conductance, not only of that emitter-base path, but as well, the very high conductance of the emitter-collector path of the parallel-connected transistor 30.

Toward insuring that this latter conductance is of a maximum value, the load resistor 26 is of substantial value. Thus, any current flowing therethrough in the collector to emitter conduction path of the transistor 20 produces a substantial voltage drop sufficient to drive the emitter-collector conduction path of the transistor 30 to a fully conducting condition. In a typical case, the biasing potential source 24, for reasons to be discussed below, may have a voltage of 1.4 volts. In this case, the load resistor 26 may conveniently have a value of 1250 ohms.

Thus, at this instant, the signal currents passing through the emitter to base path of the transistor 10 and through the emitter to collector path of the transistor 30 pass through the resistor-capacitor network 18 for detection in accordance with the well known theory.

At another instant of time, the signal applied to the coupling stage 4 may be of such a polarity that the input terminal 6 is negative with respect to the input terminal 8. At this instant, the junction between the base electrode 14 and the emitter electrode 12 is reversely biased.

Hence, little, if any, current flows across this junction. The bias potential source 22 connected between the emitter electrode of the amplifying transistor 20 and the base electrode 14 of the transisor 10 is of such a polarity, as shown, and of such a value, for example, 1.5 volts, as to drive a current through the base electrode 14 to the collector electrode 16 of the transistor 10 to the base electrode of the amplifying transistor 20. This current maintains a current flow in the collector-emitter conduction path of the amplifying transistor 20. This latter current being of near negligible proportions, only a minute voltage drop occurs across the load resistor 26. Hence, the biasing potential source 24 operates to hold the base electrode of the transistor 30 at a voltage to render very large the impedance of the principal conduction path of the transistor 30.

Thus, in accordance with the invention there are two conductive paths which are presented to a negative signal applied between the input terminals 6 and 8. The one conductive path comprises the emitter electrode 12 and the base electrode 14, and is of very low conductance by virtue of the semiconductor characteristics of the junction between these electrodes. The other conduction path presented to this signal, i.e., the conduction path from the collector to the emitter electrodes of the transistor 30, is established at a substantial zero conductance condition by virtue of the selectively Off biasing action of the potential source 24 and load resistor 26 as applied to the base electrode of the transistor 30.

Conversely, there are two high conductance, parallel-connected paths presented to positive signals applied between the input terminals 6 and 8. The path between the emitter electrode 12 and the base electrode 14 is a high conductance path by virtue of the forward bias applied to the semiconductor junction. Further, for such signals the emitter to collector path of the transistor 30 effectively constitutes a signal controlled switch in the closed or zero impedance condition. This results from the fact that signals derived at the collector 16 of the transistor 10 operate through the amplifying transistor 20 and the load resistor 26 to disable the effect of the biasing potential provided by the battery 24 for establishing the transistor switch normally in an open or low conductance condition.

Experiments have shown that the greatly increased forward conductance between terminals 6 and 8 achieved by this combination together with the negligible reverse conductance introduced by the transistor 30, associated with the biasing potential source 24 and load-resistor 26, yields a marked improvement in the rectifying ability of this circuit above and beyond that of a single junction transistor. Indeed, the ratio of the forward current from the input terminal 6 to the output terminal 8 to the reverse current between the same terminals under like voltage conditions is improved by a factor of 2,000 over the forward-to-reverse current ratio of a simple semiconductor junction. At the same time, the introduction of the properly biased amplifying element, such as the transistor 20, between the input transistor 10 and the transistor switch control electrode improves by a factor of 30 the response level of a rectifier in accordance with the invention to forward-going signals of low amplitude.

Hence, in this illustrative embodiment of the invention, there is provided a rectifying element of greatly improved sensitivity to low level signals, one which is acutely heightened in its discrimination between signals of opposite polarities and one which operates simply and automatically to achieve its desired purposes.

Turning next to Fig. 2, there is seen a simplified rectifying detecting circuit embodying the principles of the invention. The circuit of Fig. 2 being much like the circuit of Fig. 1, similar elements having similar functions are correspondingly numbered.

A modulated input signal is applied through a tuned coupling element 4 to input terminals 6 and 8; thence to an input transistor 10, comprising an emitter electrode 12 and a rectifying base electrode 14. Interconnecting this base with the input terminal 8, is a resistor-capacitor network 18 having a time constant adapted for the detection of the modulation frequency component of the applied input signal. Transistor 10 is of a conductivity type, as shown, for forwardly conducting signal currents positively from the terminal 6 to the terminal 8.

An amplifying transistor 20, of a conductivity type opposite to that of transistor 10, has its base or control electrode connected to the collector electrode of the input transistor 10. Appropriate biasing potential sources 22 and 44 and a load resistor 46 are serially connected in circuit between the emitter electrode and the collector electrode of the amplifying transistor 20. These last recited, serially connected elements, are likewise connected in circuit with the base, or rectifying, electrode 14 of the input transistor. Connected between the emitter electrode 12 of the input transistor and the collector electrode of the amplifying transistor 20 is a diode 50 which may conveniently be a junction diode such as described in Patent 2,402,661, granted to R. S. Ohl on June 25, 1946. This diode is connected with a polarity to conduct with low impedance currents of a like sense to those conducted with a low impedance by the junction barrier between the input emitter electrode 12 and the rectifying base electrode 14.

Bias potential sources 22 and 44 together with the load resistor 46 are chosen of such a value as to maintain a vestigial reverse current flowing through the rectifying base electrode 14 to the output collector electrode 16 of the transistor 10. Thence this current flows to the base electrode of the transistor 20 thereby maintaining a minor, but real, current flow through the resistor 46 and the conduction path between the collector and the emitter electrodes of the transistor 20 at times when input terminal 6 is at a zero or lesser potential with respect to the terminal 8. The voltage drop across the resistor 46 resulting from this minor current is of such a low value, that the biasing potential source 44 maintains the diode 50 in a nonconducting or reversely biased condition.

Conversely, a signal which establishes the terminal 6 at a positive potential with respect to the terminal 8 drives the transistor 10 into a conducting condition. Thereupon, under the selective control of the currents flowing from the collector electrode 16, the transistor 20 is driven to a fully conducting condition. Hence, the current flowing through the resistor 46 is of a value to develop a voltage thereacross to oppose and overcome the reverse biasing effect of the potential source 44 upon the diode 50. In fact, as the transistor 20 approaches a fully conducting condition, diode 50 is forwardly biased by a voltage approaching that of potential source 22. Whence, the diode 50 becomes highly conducting and presents a high conductance path in parallel with the conductance path between the emitter electrode 12 and the base electrode 14 of the transistor 10.

Thus, in this embodiment of the principles of the invention, it is seen that selective enablement of an additional conduction path, here provided by the diode 50, connected in parallel with the rectifying junction of the input transistor 10, under the control of the amplified signal derived from that input transistor, provides greatly increased forward conductivity to a rectifier in accordance with the invention. At the same time, there is no corresponding decrease in the reverse resistance of the rectifier. Whence, the illustrative circuit shown in Fig. 2, provides a disproportionately improved efficiency over rectifiers of the prior art.

There have been described heretofore two illustrative embodiments of the invention. It is apparent to those skilled in the art that the principles of the invention may be embodied in many other varied forms.

What is claimed is:

1. Apparatus for rectifying an input signal which comprises an input transistor of a given conductivity type comprising an emitter electrode, a base electrode and a collector electrode, means for applying said signal between said emitter electrode and said base electrode thereby to derive a signal at said collector electrode in response to currents flowing between said emitter electrode and said base electrode, an amplifying transistor of an opposite conductivity type connected in circuit with said collector electrode for deriving an output control signal, a semiconductor body comprising a variable impedance conduction path, said path being connected between said emitter electrode and said base electrode, said body being responsive to control signals applied thereto for establishing a low impedance value for said conduction path, and means for applying said output control signal to said semiconductor body thereby to drive said conduction path to a low impedance condition in response to signal currents flowing between said emitter electrode and said base electrode.

2. Apparatus for rectifying an input signal which comprises a semiconductor body having an input electrode and a rectifying electrode for conducting with a low impedance signal currents of a given polarity applied therebetween and for presenting a high impedance to applied signals of an opposite polarity, a second semiconductor body connected in parallel between said input electrode and said rectifying electrode, said second semiconductor body comprising a variable impedance conduction path and being responsive to control signals applied thereto for establishing a low impedance condition in said conduction path, biasing means for normally holding said conduction path in a high impedance condition, means for applying a control signal to said second semiconductor body in response to signal currents flowing from said input electrode to said rectifying electrode, means for permitting the impedance condition of said variable impedance conduction path to correspond coincidentally to the impedance condition of the conducting path between said input and rectifying electrodes, and means for applying said input signal between said input electrode and said rectifying electrode.

3. Apparatus for rectifying an input signal which comprises an input transistor of a given conductivity type, said transistor comprising an emitter electrode, a base electrode, and a collector electrode, means for applying said input signal between said emitter electrode and said base electrode, a second transistor of said given conductivity type comprising a principal conduction path connected in parallel between said emitter electrode and said base electrode, biasing means connected to said second transistor for normally establishing said conduction path in a high impedance condition, and amplifying transistor means of an opposite conductivity type connected in circuit with said collector electrode and with said biasing means for amplifying signals derived at said collector electrode and for translating said signals to said second transistor, thereby selectively to inhibit the action of said biasing means.

4. Apparatus as set forth in claim 3 wherein said biasing means comprises a potential source and a resistor serially connected with a principal conduction path of said amplifying transistor means.

5. Apparatus as set forth in claim 4 and in combination therewith a biasing potential source serially connected in circuit between a principal conduction path electrode of said amplifying transistor and said base electrode and poled for reversely biasing said base electrode and said collector electrode.

6. A unidirectional signal translating device comprising a first input terminal, a second input terminal, a first transistor, the emitter and base electrodes of said first transistor being connected to said first input terminal and said second input terminal respectively, a second transistor, the emitter and collector electrodes of said second transistor being connected to said first input terminal and to said second input terminal respectively, and means interconnecting the collector electrode of said first transistor with the base electrode of said second transistor for switching the emitter-to-collector conduction path of said second transistor from a high impedance state to a low impedance state in response to currents flowing from the emitter electrode to the base electrode of said first transistor.

7. Apparatus for rectifying an input signal which comprises a three-electrode semiconductor including a circuit path between a first and second of said electrodes exhibiting substantially an open circuit characteristic for signals applied thereto of a first polarity and substantially a short-circuit characteristic for signals applied thereto of a second polarity, means for applying said input signal between said first and second electrodes, a signal-controlled switch capable of exhibiting either of said characteristics exhibited by said circuit path connected in parallel with said circuit path, and means connected in circuit with a third of said electrodes for applying a control signal to said switch, said switch being constructed to respond to said control signal in such manner that said switch and said circuit path simultaneously exhibit corresponding of said characteristics.

8. Apparatus for rectifying an input signal which comprises a three-electrode junction transistor comprising an emitter electrode, a base electrode, and a collector electrode, a first variable conduction path included in said transistor between said emitter electrode and said base electrode exhibiting a high impedance for signals applied thereto of a first polarity and a low impedance for signals applied thereto of a second polarity, means for applying said input signal between said emitter electrode and said base electrode, whereby a current signal appears at said collector electrode in response to currents flowing from said emitter electrode to said base electrode, a second variable conduction path connected in parallel with said first variable conduction path, said second variable conduction path being capable of exhibiting either a high impedance condition or a low impedance condition, and means connected in circuit with said collector electrode for shifting the impedance condition of said second variable conduction path to simultaneously correspond to the impedance condition exhibited by said first variable conduction path.

References Cited in the file of this patent

UNITED STATES PATENTS

| | | |
|---|---|---|
| 2,698,416 | Sherr | Dec. 28, 1954 |
| 2,776,382 | Jensen | Jan. 1, 1957 |
| 2,823,322 | Trousdale | Feb. 11, 1958 |
| 2,832,900 | Ford | Apr. 29, 1958 |
| 2,855,559 | Goodrich | Oct. 7, 1958 |
| 2,885,570 | Bright et al. | May 5, 1959 |

FOREIGN PATENTS

| | | |
|---|---|---|
| 1,122,426 | France | May 22, 1956 |